(12) United States Patent
Eom et al.

(10) Patent No.: US 8,830,195 B2
(45) Date of Patent: Sep. 9, 2014

(54) TOUCH SCREEN PANEL ACTIVE MATRIX ORGANIC LIGHT EMITTING DIODE DISPLAY DEVICE

(75) Inventors: Sang Yong Eom, Suwon-si (KR); Dong Sub Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 116 days.

(21) Appl. No.: 13/423,646

(22) Filed: Mar. 19, 2012

(65) Prior Publication Data

US 2013/0016049 A1      Jan. 17, 2013

(30) Foreign Application Priority Data

Jul. 13, 2011   (KR) .................. 10-2011-0069261

(51) Int. Cl.
*G06F 3/041* (2006.01)
*H01L 27/32* (2006.01)
*H04M 1/02* (2006.01)
*H04M 1/18* (2006.01)
*H05K 1/14* (2006.01)

(52) U.S. Cl.
CPC ............... *H01L 27/323* (2013.01); *H04M 1/18* (2013.01); *H05K 1/147* (2013.01); *H04M 1/0266* (2013.01)
USPC ......................................... 345/173

(58) Field of Classification Search
USPC ...................... 345/60, 102, 173–177; 349/61; 362/613, 150–151; 2/60, 102
See application file for complete search history.

(56) References Cited

U.S. PATENT DOCUMENTS

| | | | |
|---|---|---|---|
| 7,414,851 B2 * | 8/2008 | You ................................ | 361/719 |
| 7,880,715 B2 * | 2/2011 | Hwang et al. ................. | 345/102 |
| 2005/0024553 A1 | 2/2005 | Fukuta et al. | |
| 2005/0243239 A1 | 11/2005 | Kondo et al. | |
| 2010/0110040 A1 | 5/2010 | Kim et al. | |
| 2011/0034033 A1 * | 2/2011 | Halls et al. .................... | 438/758 |

OTHER PUBLICATIONS

IntoMobile.com et al: "Samsung Flexible AMOLED Display at CES 2011" Jan. 8, 2011.

* cited by examiner

*Primary Examiner* — Andrew Sasinowski
(74) *Attorney, Agent, or Firm* — Jefferson IP Law, LLP

(57) ABSTRACT

A touch screen panel Active Matrix Organic Light Emitting Diode (AMOLED) display device for decreasing the thickness of a mobile terminal and improving a degree of freedom in design is provided. The touch screen panel AMOLED display device includes a flexible AMOLED disposed on the bottom of a window, and a Chip-On-Film (COF) film connected to the flexible AMOLED and coupled with a flexible AMOLED driver Integrated Circuit (IC). Therefore, the thickness of the touch screen panel AMOLED display device may be decreased, and damage of the AMOLED due to an external shock may be prevented. Additionally, separation of the flexible AMOLED driver IC from a mounting surface may be prevented.

11 Claims, 4 Drawing Sheets

TOUCH SCREEN PANEL ACTIVE MATRIX ORGANIC LIGHT EMITTING DIODE DISPLAY DEVICE

PRIORITY

This application claims the benefit under 35 U.S.C. §119(a) of a Korean patent application filed on Jul. 13, 2011 in the Korean Intellectual Property Office and assigned Serial No. 10-2011-0069261, the entire disclosure of which is hereby incorporated by reference.

BACKGROUND OF THE INVENTION

1. Field of the Invention

The present invention relates to a display device including a touch screen panel. More particularly, the present invention relates to a touch screen panel Active Matrix Organic Light Emitting Diode (AMOLED) display device.

2. Description of the Related Art

Recently, touch screen panel display devices have been applied to mobile terminals to decrease the weight and thickness of the mobile terminal and to increase a display area thereof. Among various touch screen panel display devices, a touch screen panel AMOLED display device that uses an AMOLED having a high optical characteristic is used most frequently.

FIG. 1 is a cross-sectional view of a touch screen panel AMOLED display device according to the related art.

Referring to FIG. 1, the touch screen panel AMOLED display device 100 includes an AMOLED 110 and a window 120. The AMOLED 110 includes a Low Temperature Polycrystalline Silicon (LTPS) glass 111, an encap glass 112 for sealing the top of the LTPS glass 111, and a protective film 115 formed on the bottom of the LTPS glass 111. A sponge 116 is disposed on the bottom of the protective film 115, and an AMOLED Flexible Printed Circuit Board (FPCB) 113 is attached on the bottom of sponge 116 by an adhesive tape 117. An AMOLED driver Integrated Circuit (IC) 114 is disposed at an edge of the top of the LTPS glass 111. An electronic component 119 is mounted on a surface of the AMOLED FPCB 113 opposite to the surface on which the sponge 116 is attached, and a bracket 140 is disposed at a surface of the AMOLED FPCB 113 opposite to the surface on which the sponge 116 is attached.

A touch screen sensor pattern 130 is formed on the top of the encap glass 112, and a touch screen FPCB 131 on which a touch screen IC 132 is attached at an edge of the top of the encap glass 112. A polarizing plate 123 is formed on the top of the touch screen sensor pattern 130, and a resin layer 121 is formed between the polarizing plate and the window 120.

The LTPS glass 111 and the encap glass 112 that constitute the AMOLED 110 of the touch screen panel AMOLED display device 100 are glass substrates each having a thickness equal to or greater than 0.3 T. Accordingly, the thickness $h_1$ between the bottom of the adhesive tape 117 and the top of the polarizing plate 123 is at least 1.2 T, and the thickness $h_2$ between the bottom of the resin layer 121 and the top of the window 120 is at least 0.95 T. Therefore, a decrease of the thickness of the touch screen panel AMOLED display device 100 is limited. Also, there are problems in that the AMOLED 110 may be damaged due to an external shock and that the AMOLED driver IC 114 mounted on the LTPS glass 111 may be separated from the LTPS glass 111.

SUMMARY OF THE INVENTION

Aspects of the present invention are to address the above mentioned problems and/or disadvantages and to provide at least the advantages described below. Accordingly, an aspect of the present invention is to provide a touch screen panel Active Matrix Organic Light Emitting Diode (AMOLED) display device to decrease the thickness of the touch screen panel AMOLED display device, and prevent damage to the AMOLED due to an external shock.

Another aspect of the present invention is to provide a touch screen panel AMOLED display device that prevents separation of a flexible AMOLED driver Integrated Circuit (IC) from a mounting surface and damage thereof.

In accordance with an aspect of the present invention, a touch screen panel AMOLED display device is provided. The touch screen panel AMOLED display device includes a flexible AMOLED disposed on the bottom of a window, and a Chip-On-Film (COF) film connected to the flexible AMOLED and coupled with a flexible AMOLED driver IC.

According to exemplary embodiments of the present invention, the thickness of the touch screen panel AMOLED display device may be decreased and damage to the AMOLED due to external shock may be prevented by using the flexible AMOLED. Additionally, separation of the flexible AMOLED driver IC from the mounting surface may be prevented by using a COF film on which the flexible AMOLED driver IC is mounted.

Additionally, damage to the flexible AMOLED driver IC due to external shock may be prevented by attaching a buffer member that protects the flexible AMOLED driver IC from external shock to the rear of the flexible AMOLED.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to their bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 2:
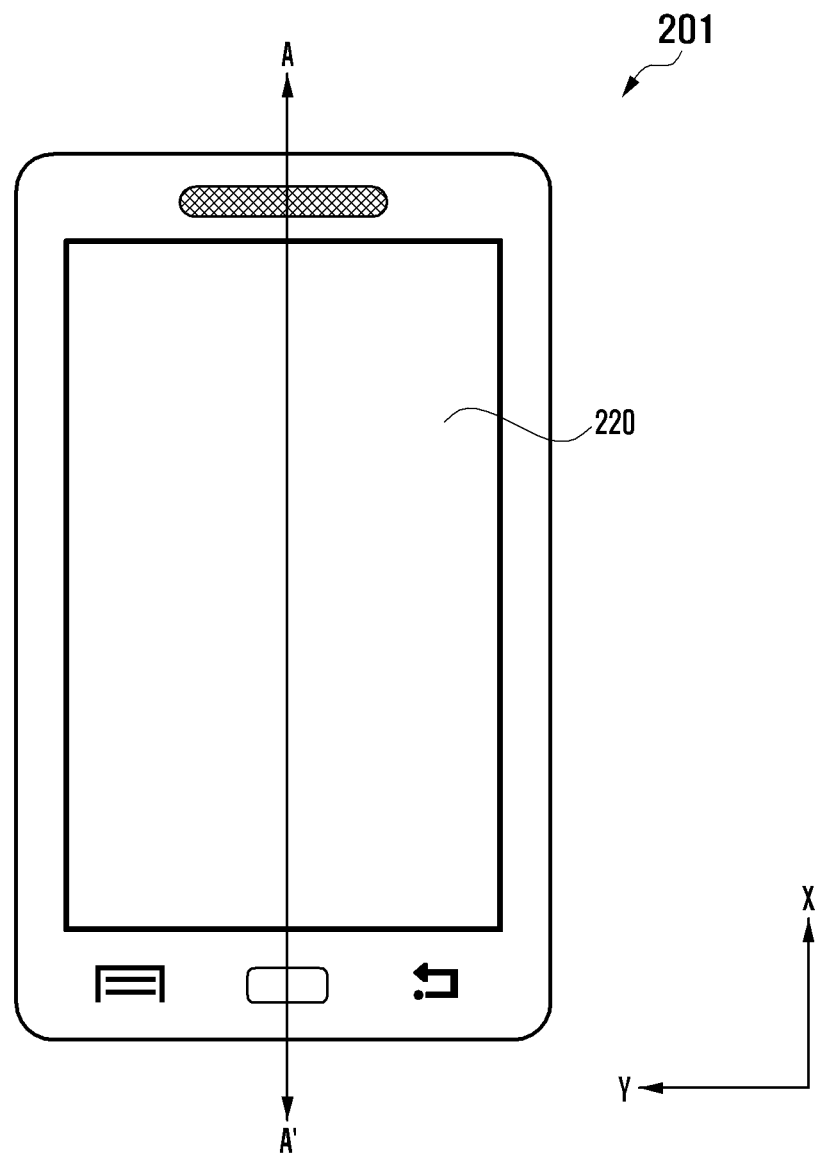
FIG. 2 is a plan view of a mobile terminal having a touch screen panel AMOLED display device according to an exemplary embodiment of the present invention.
Figure 3:
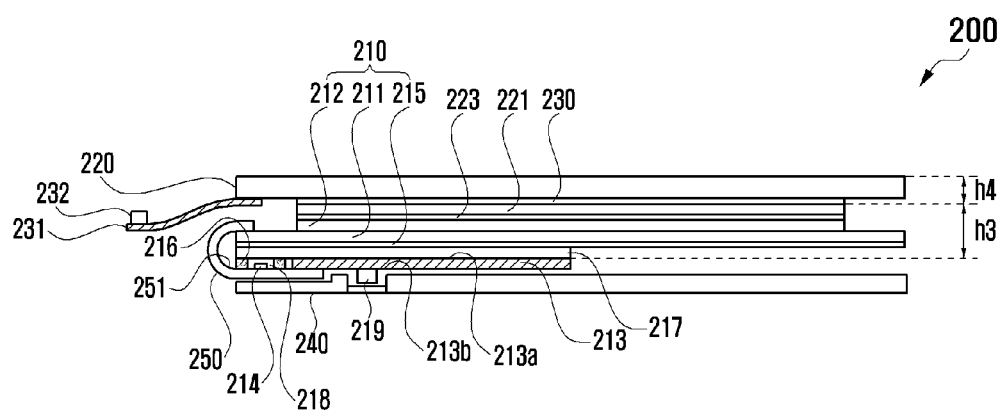
FIG. 3 is a cross-sectional view of the touch screen panel AMOLED display device along the line A-A' in FIG. 2 according to an exemplary embodiment of the present invention.
Figure 4:
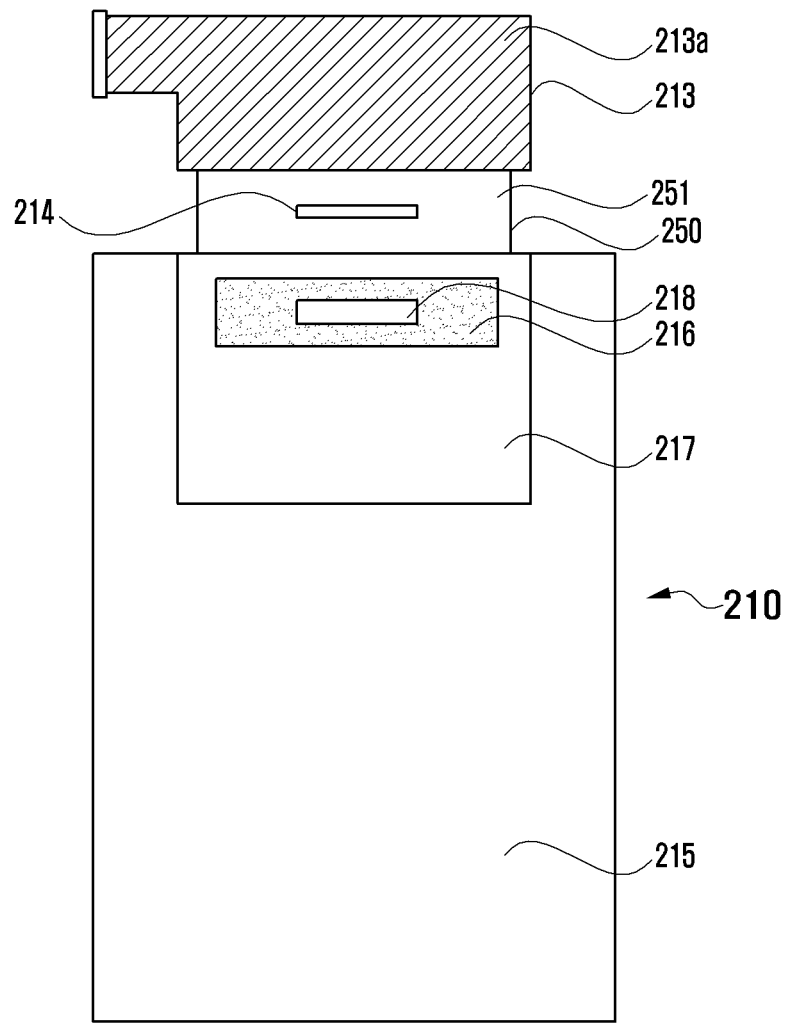
FIG. 4 is a rear view of the flexible AMOLED shown in FIG. 3 according to an exemplary embodiment of the present invention.

FIG. 2 is a plan view of a mobile terminal having a touch screen panel Active Matrix Organic Light Emitting Diode (AMOLED) display device according to an exemplary embodiment of the present invention, FIG. 3 is a cross-sectional view of the touch screen panel AMOLED display device along the line A-A' in FIG. 2 according to an exemplary embodiment of the present invention, and FIG. 4 is a rear view of the flexible AMOLED shown in FIG. 3 according to an exemplary embodiment of the present invention. The line A-A' shown in FIG. 2 passes through a window 220 along an X axis direction which is a longitudinal direction of a mobile terminal 201, and a flexible AMOLED Flexible Printed Circuit Board (FPCB) 213 shown in FIG. 4 is shown in an exploded state before it is attached to the rear of a flexible AMOLED 210.

Referring to FIG. 2 through FIG. 4, a touch screen panel AMOLED display device 200 according to an exemplary embodiment of the present invention is described hereinafter. The touch screen panel AMOLED display device 200 includes the flexible AMOLED 210, a Chip-On-Film (COF) film 250, the flexible AMOLED FPCB 213, a buffer member 216, and the window 220.

The flexible AMOLED 210 is an AMOLED made of a film material, and includes a polymer substrate 211, a thin film transistor layer 212 and a protective film 215. In an exemplary implementation, the polymer substrate 211 is a flexible plastic substrate, and may be made of polyimide, silica resin, acryl, and the like. The thin film transistor layer 212 is laminated on the top of the polymer substrate 211, and operates as a display element layer. A polarizing plate 223 is formed on the top of the thin film transistor layer 212 to prevent reflection of exterior light from the flexible AMOLED 210. The protective film 215 is formed on the bottom of the polymer substrate 211, and protects the flexible AMOLED 210 from shock from the bottom thereof.

The COF film 250 is a film on which a flexible AMOLED driver Integrated Circuit (IC) 214 is mounted. One end of a COF film mounting surface 251, on which the flexible AMOLED driver IC 214 is mounted, is connected to the flexible AMOLED FPCB 213, and the other end of the COF film mounting surface 251 is connected to the flexible AMOLED 210. As shown in FIG. 3, in a state in which the flexible AMOLED FPCB 213 is attached to the rear of the flexible AMOLED 210, the COF film 250 is folded to place the flexible AMOLED driver IC 214 in an internal space 218 of the buffer member 216.

The flexible AMOLED FPCB 213 is a component for driving the flexible AMOLED driver IC 214 by a control signal from a controller (not shown). The flexible AMOLED FPCB 213 has a mounting surface 213b on which an electronic component 219 is mounted, and an attachment layer 213a that is formed at a surface opposite to the mounting surface 213b and is attached to the rear of the flexible AMOLED 210 by an adhesive tape 217. The mounting surface 213b of the flexible AMOLED FPCB 213 is connected to an end of the COF film mounting surface 251, and faces towards a bracket 240.

The buffer member 216 is a component that protects the flexible AMOLED driver IC 214 from external shock, and is connected to the rear of the flexible AMOLED 210 by the adhesive tape 217. The buffer member 216 may include a sponge material. Additionally, the internal space 218 may be formed at the center of the buffer member 216 thus creating a space in which to place the flexible AMOLED driver IC 214. In an exemplary implementation, the thickness of the buffer member 216 is equal to that of the flexible AMOLED FPCB 213. Therefore, an increase of the thickness of the display device 200 due to the buffer member 216 may be avoided.

The window 220 is a component that protects the flexible AMOLED 210 from external shock and allows an image of the flexible AMOLED 210 to be directed towards a user. Furthermore, the window 220 is laminated on the top of the flexible AMOLED 210. A touch screen sensor pattern 230 is formed on the rear of the window 220, a touch screen FPCB 231 on which a touch screen IC 232 is mounted is attached at an edge of the rear of the window 220, and the touch screen FPCB 231 and the touch screen sensor pattern 230 are connected by a metal trace (not shown). Additionally, an Optically Clear Adhesive (OCA) 221 is formed between the touch screen sensor pattern 230 and the polarizing plate 223.

According to an exemplary embodiment of the present invention, because the touch screen panel AMOLED display device 200 includes the flexible AMOLED 210 having a substrate of a film material, the thickness of the touch screen panel AMOLED display device 200 may be decreased and damage of the AMOLED due to an external shock may be prevented. For reference, the thickness $h_3$ between the bottom of the adhesive tape 217 and the top of the OCA 221 is measured to be 0.335 T, and the top of the thickness $h_4$ between the touch screen sensor pattern 230 and the window 220 is measured to be 0.85 T.

Figure 1:
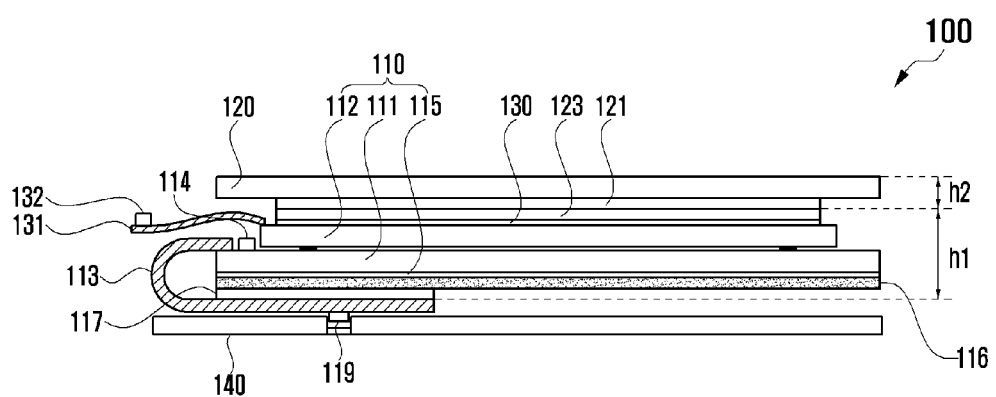
FIG. 1 is a cross-sectional view of a touch screen panel Active Matrix Organic Light Emitting Diode (AMOLED) display device according to the related art.

Additionally, according to an exemplary embodiment of the present invention, the flexible AMOLED driver IC 214 is mounted on the COF film 250. Because the COF film 250 has a friction force greater than that of the LTPS glass 111 shown in FIG. 1, separation of the flexible AMOLED driver IC 214 from the mounting surface 251 may be prevented. Additionally, because the buffer member 216 is positioned along a side of the flexible AMOLED driver IC 214, damage of the flexible AMOLED driver IC 214 due to an external shock may be avoided even in a state in which the flexible AMOLED driver IC 214 is mounted on the flexible COF film 250.

While the invention has been shown and described with reference to certain exemplary embodiments thereof, it will be understood by those skilled in the art that various changes in form and details may be made therein without departing from the spirit of the invention as defined by the appended claims and their equivalents.

What is claimed is:

1. A touch screen panel Active Matrix Organic Light Emitting Diode (AMOLED) display device, the device comprising:
  a flexible AMOLED disposed on the bottom of a window;
  a Chip-On-Film (COF) film connected to the flexible AMOLED and coupled directly to a flexible AMOLED driver Integrated Circuit (IC); and a flexible AMOLED Flexible Printed Circuit Board (FPCB) connected at a first end of a mounting surface of the COF film on which the flexible AMOLED driver IC is mounted.

2. The device of claim 1, further comprising a buffer member coupled on the rear of the flexible AMOLED, to protect the flexible AMOLED driver IC from an external shock.

3. The device of claim 2,
wherein a thickness of the buffer member is substantially equal to that of the flexible AMOLED Flexible Printed Circuit Board (FPCB).

4. The device of claim 2, wherein the buffer member comprises a sponge material.

5. The device of claim 2, wherein the buffer member is configured having an internal space in which the AMOLED driver IC is located.

6. The device of claim 1, wherein the flexible AMOLED is connected to a second end of the COF film mounting surface, the second end being opposite to the first end.

7. The device of claim 1, wherein the flexible AMOLED FPCB is attached on the rear of the flexible AMOLED by an adhesive tape.

8. The device of claim 1, wherein the flexible AMOLED comprises a polymer substrate, and a thin film transistor layer laminated on the top of the polymer substrate.

9. The device of claim 8, wherein the polymer substrate comprises one of polyimide, silica resin, and acryl.

10. The device of claim 1, further comprising a touch screen sensor pattern on a rear surface of the window.

11. The device of claim 1, wherein the flexible AMOLED comprises a film.

\* \* \* \* \*